US012412813B2

(12) United States Patent
Takeuchi

(10) Patent No.: US 12,412,813 B2
(45) Date of Patent: Sep. 9, 2025

(54) SEMICONDUCTOR MODULE

(71) Applicant: Mitsubishi Electric Corporation, Tokyo (JP)

(72) Inventor: Kensuke Takeuchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 461 days.

(21) Appl. No.: 17/794,870

(22) PCT Filed: May 19, 2020

(86) PCT No.: PCT/JP2020/019718
§ 371 (c)(1),
(2) Date: Jul. 22, 2022

(87) PCT Pub. No.: WO2021/234803
PCT Pub. Date: Nov. 25, 2021

(65) Prior Publication Data
US 2023/0096581 A1    Mar. 30, 2023

(51) Int. Cl.
*H01L 23/495*    (2006.01)
*H01L 23/00*    (2006.01)
(Continued)

(52) U.S. Cl.
CPC .... *H01L 23/4952* (2013.01); *H01L 23/49562* (2013.01); *H01L 23/58* (2013.01);
(Continued)

(58) Field of Classification Search
CPC ........... H01L 23/4952; H01L 23/49562; H01L 23/58; H01L 24/37; H01L 24/40;
(Continued)

(56) References Cited

U.S. PATENT DOCUMENTS

2016/0294379 A1\* 10/2016 Hayashiguchi ...... H03K 17/122
2018/0096922 A1   4/2018 Chen
(Continued)

FOREIGN PATENT DOCUMENTS

DE    10 2017 223 060 A1    10/2018
EP        3 174 185 A1     5/2017
(Continued)

OTHER PUBLICATIONS

Office Action dated Nov. 1, 2022 issued by the Japanese Patent Office in Japanese Application No. 2022-523782.
(Continued)

*Primary Examiner* — Robert G Bachner
(74) *Attorney, Agent, or Firm* — Sughrue Mion, PLLC

(57) ABSTRACT

The present disclosure includes: a base plate having a shape of a sheet; a relay plate having a shape of a sheet; a terminal member; and an electronic component joined to one surface of the base plate. The base plate, the relay plate, and the terminal member are electrically conductive members and arranged on a same plane with gaps between the electrically conductive members. The electronic component and one surface of the relay plate are connected to each other by a bonding wire. The one surface of the relay plate and one surface of the terminal member are connected to each other by a bonding wire.

9 Claims, 5 Drawing Sheets

(51) Int. Cl.
  *H01L 23/58*   (2006.01)
  *H02M 1/00*    (2007.01)
  *H02M 7/5387*  (2007.01)

(52) U.S. Cl.
  CPC .............. *H01L 24/37* (2013.01); *H01L 24/40* (2013.01); *H01L 24/48* (2013.01); *H01L 2224/37147* (2013.01); *H01L 2224/40137* (2013.01); *H01L 2224/40245* (2013.01); *H01L 2224/48091* (2013.01); *H01L 2224/48245* (2013.01); *H01L 2224/48265* (2013.01); *H01L 2224/73221* (2013.01); *H01L 2924/19043* (2013.01); *H02M 1/0009* (2021.05); *H02M 7/53871* (2013.01)

(58) Field of Classification Search
  CPC ........... H01L 24/48; H01L 2224/37147; H01L 2224/40137; H01L 2224/40245; H01L 2224/48091; H01L 2224/48245; H01L 2224/48265; H01L 2224/73221; H01L 2924/19043; H01L 23/62; H01L 23/49517; H01L 23/49541; H01L 23/49811; H01L 24/41; H01L 2224/0603; H01L 2224/32245; H01L 2224/40139; H01L 2224/48097; H01L 2224/48247; H01L 2224/73265; H01L 2924/181; H02M 1/0009; H02M 7/53871; H02M 7/003

See application file for complete search history.

(56) References Cited

U.S. PATENT DOCUMENTS

| | | | |
|---|---|---|---|
| 2018/0309441 A1* | 10/2018 | Shiraishi | ........... H01L 23/49575 |
| 2019/0173461 A1 | 6/2019 | Hayashiguchi et al. | |
| 2021/0028779 A1 | 1/2021 | Hayashiguchi et al. | |

FOREIGN PATENT DOCUMENTS

| | | | |
|---|---|---|---|
| JP | 62-37955 | A | 2/1987 |
| JP | 2-177354 | A | 7/1990 |
| JP | 2015-228447 | A | 12/2015 |
| JP | 2018-125424 | A | 8/2018 |
| JP | 2018-186600 | A | 11/2018 |
| WO | 2015/076257 | A1 | 5/2015 |

OTHER PUBLICATIONS

Extended European Search Report issued Jul. 10, 2023 in European Application No. 20936107.0.
International Search Report for PCT/JP2020/019718 dated Aug. 11, 2020 [PCT/ISA/210].

\* cited by examiner

SEMICONDUCTOR MODULE

CROSS REFERENCE TO RELATED APPLICATIONS

This application is a National Stage of International Application No. PCT/JP2020/019718 filed May 19, 2020.

TECHNICAL FIELD

The present disclosure relates to a semiconductor module.

BACKGROUND ART

A semiconductor module including therein a semiconductor switching element is used for a power conversion device or the like. The semiconductor module is obtained by mounting a plurality of semiconductor switching elements on a base plate serving as an electrically conductive member, connecting, by means of jumper wires or bonding wires, electrode pads provided on the upper surfaces of the semiconductor switching elements, and then sealing these components with a mold resin. A plurality of terminal portions such as positive and negative power supply terminals, an output terminal for a load, and a control terminal for controlling each semiconductor switching element are arrayed on side surfaces on the outer periphery of the mold resin. In addition to the plurality of semiconductor switching elements, a shunt resistor for current detection and the like are also mounted inside the semiconductor module.

If the length of a bonding wire provided inside the semiconductor module is excessively large, wire sagging, or wire sweep due to flow of the mold resin in a mold resin molding step, might occur. The occurrence of the wire sagging or the wire sweep leads to a problem that wire disconnection or short-circuiting due to contact between wires might occur. A three-dimensional wiring structure in which a relay wire member is disposed on a base plate, and a structure in which a relay for connection is performed via the relay wire member by means of wire bonding performed at a plurality of positions, have been disclosed to inhibit wire sagging and wire sweep (see, for example, Patent Document 1).

CITATION LIST

Patent Document

Patent Document 1: Japanese Laid-Open Patent Publication No. 2018-125424

SUMMARY OF THE INVENTION

Problems to be Solved by the Invention

In an internal structure of a semiconductor module in the above Patent Document 1, bonding wires are connected via the relay wire member, in the three-dimensional wiring structure, which is disposed on the base plate. Consequently, wire sagging and wire sweep can be inhibited. However, since the wiring structure is three-dimensional, the height of a loop of the bonding wires is increased. Thus, the thickness of the mold resin is increased, resulting in a problem that the semiconductor module is upsized.

Considering this, an object of the present disclosure is to provide a semiconductor module in which bonding wire sagging and bonding wire sweep are inhibited, and furthermore, the thickness of a mold resin which performs sealing for the semiconductor module is reduced.

Solution to the Problems

A semiconductor module according to the present disclosure includes: a base plate having a shape of a sheet; a relay plate having a shape of a sheet; a terminal member; and an electronic component joined to one surface of the base plate. The base plate, the relay plate, and the terminal member are electrically conductive members and arranged on a same plane with gaps between the electrically conductive members. The electronic component and one surface of the relay plate are connected to each other by a bonding wire. The one surface of the relay plate and one surface of the terminal member are connected to each other by a bonding wire.

Effect of the Invention

In the semiconductor module according to the present disclosure, the base plate, the relay plate, and the terminal member are electrically conductive members and arranged on the same plane with gaps between the electrically conductive members, the electronic component and the one surface of the relay plate are connected to each other by a bonding wire, and the one surface of the relay plate and the one surface of the terminal member are connected to each other by a bonding wire. Consequently, bonding wire sagging and bonding wire sweep can be inhibited, and furthermore, the thickness of a mold resin which performs sealing for the semiconductor module can be reduced.

DESCRIPTION OF EMBODIMENTS

Figure 1:
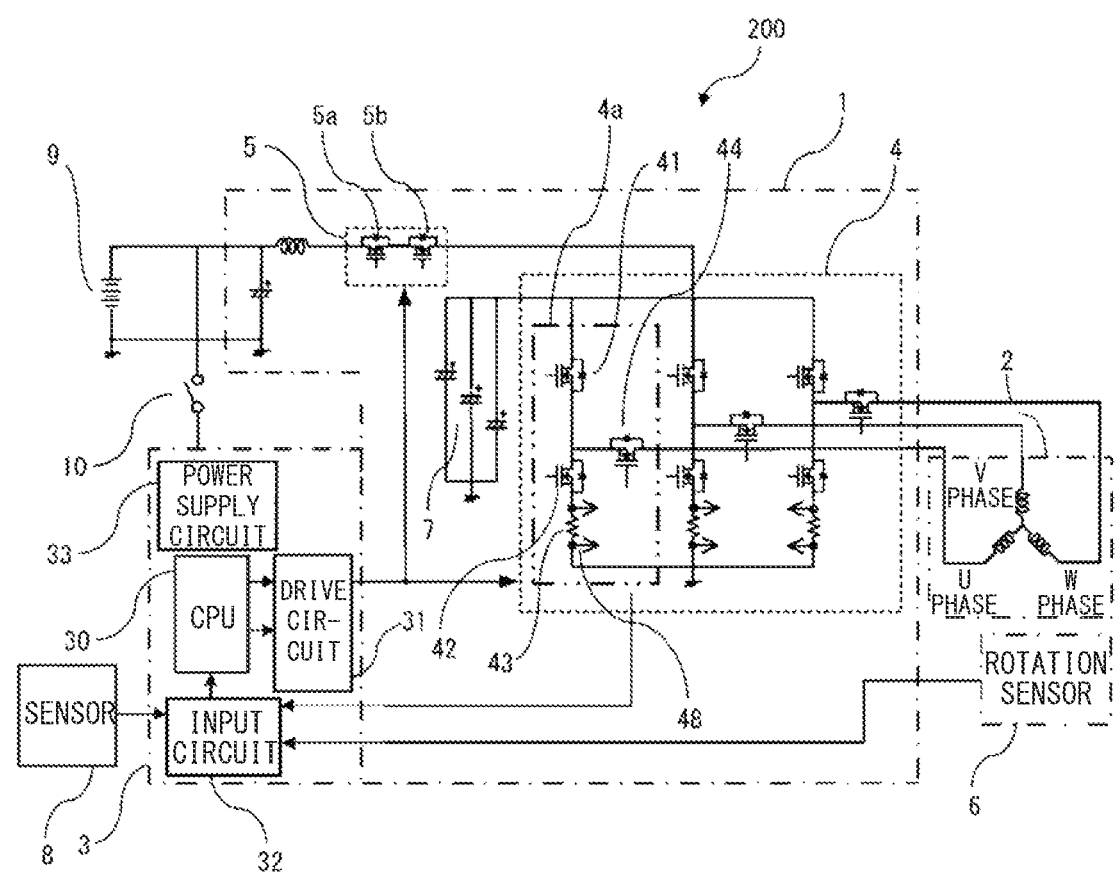
FIG. 1 illustrates a circuit configuration of a device including a semiconductor module according to embodiment 1.

Hereinafter, semiconductor modules according to embodiments of the present disclosure will be described with reference to the drawings. Description will be given while the same or corresponding members and parts in the drawings are denoted by the same reference characters.

Embodiment 1

Figure 2:
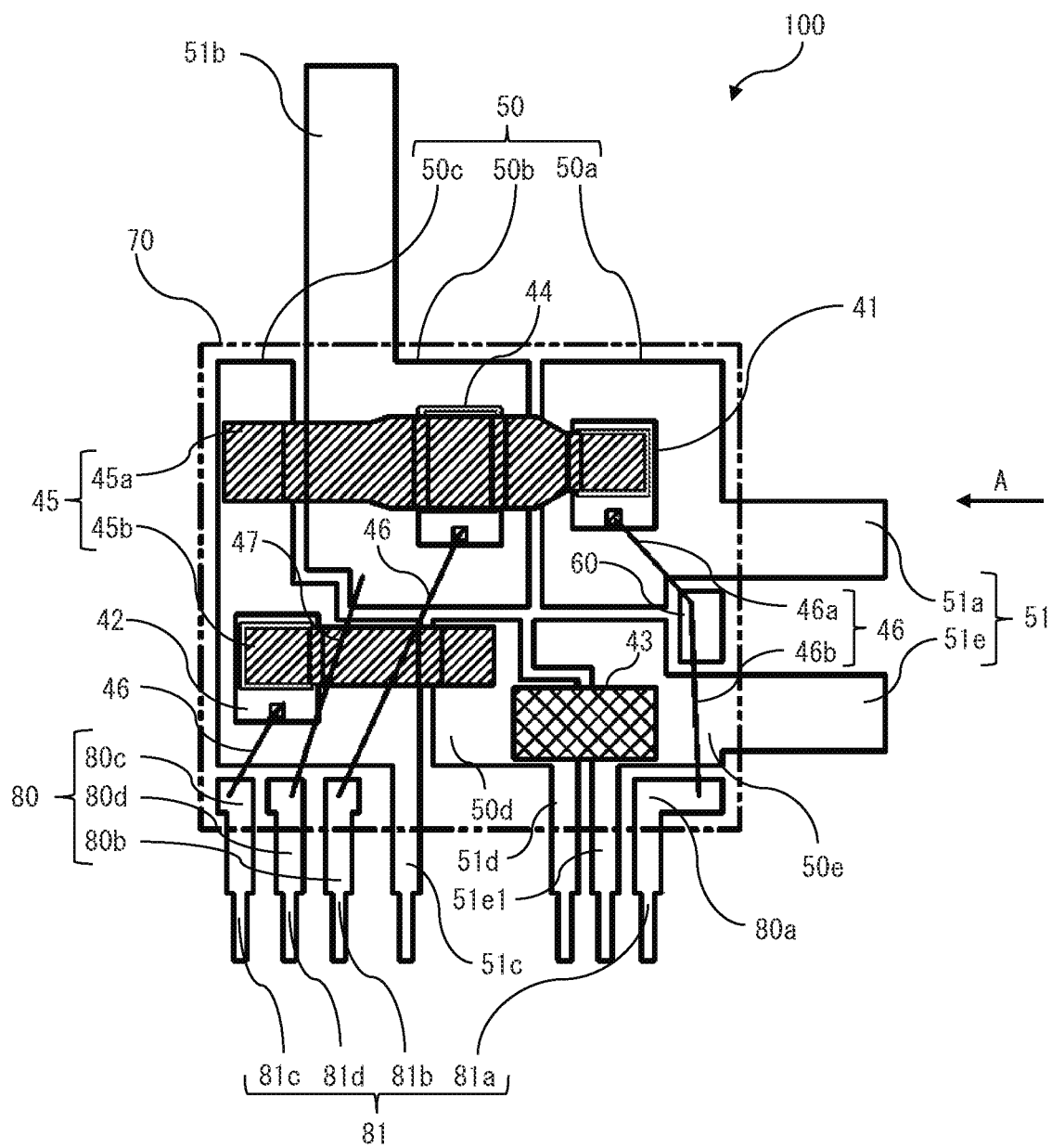
FIG. 2 is a plan view showing the semiconductor module according to embodiment 1.
Figure 3:
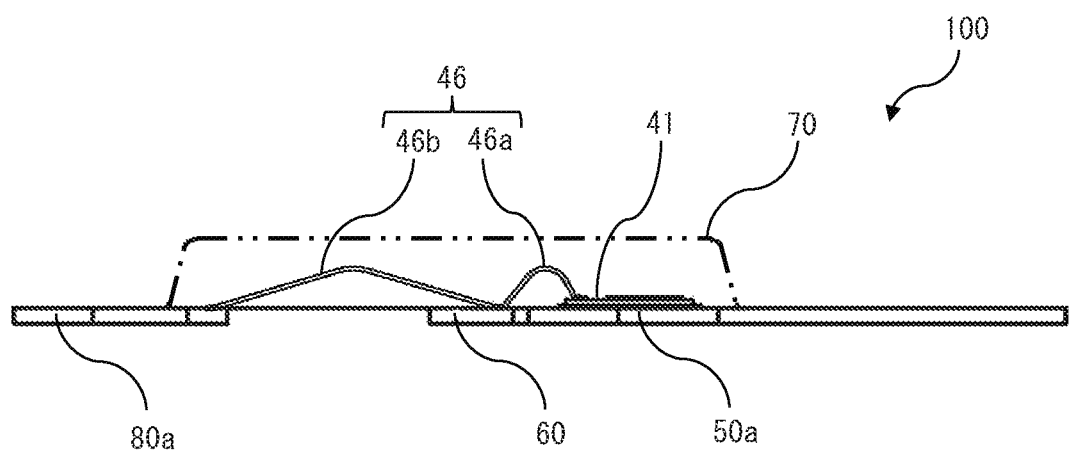
FIG. 3 is a side view showing the semiconductor module according to embodiment 1.

FIG. 1 illustrates a circuit configuration of the entirety of a system of an electric power steering device 200 including a semiconductor module 100 according to embodiment 1. FIG. 2 is a plan view showing an internal configuration of the semiconductor module 100. FIG. 3 is a side view showing a major part of the internal configuration of the semiconductor module 100. In each of FIG. 2 and FIG. 3, a mold resin 70 is excluded, and the alternate long and two short dashes line indicates the external shape of the mold resin 70. FIG. 3 is a side view as seen in the direction of the arrow A shown in FIG. 2. The semiconductor module 100 is a module that is used for a power conversion device or the like and that includes therein a plurality of semiconductor switching elements 41, 42, and 44 for performing power conversion.

<Electric Power Steering Device 200>

The electric power steering device 200 will be described as an example of the device including the semiconductor module 100. The electric power steering device 200 is a device that converts power supplied from a battery 9 and that outputs power obtained by the conversion to a motor 2. As shown in FIG. 1, the electric power steering device 200 is composed of a control unit 1, the motor 2, the battery 9, an ignition switch 10, and sensors such as a rotation sensor 6. The motor 2 is a brushless motor composed of windings for three phases (a U phase, a V phase, and a W phase). The rotation sensor 6 is disposed near the motor 2, detects a rotation angle of the motor 2, and outputs the rotation angle to a control circuit 3 of the control unit 1. A sensor 8 includes a torque sensor for detecting steering wheel operation force, a vehicle speed sensor, and the like, and outputs an electric signal based on physical quantities detected by the respective sensors to the control circuit 3.

The control unit 1 is composed of: the control circuit 3 including a CPU 30; an inverter circuit 4 for supplying current to the windings of the motor 2; a power supply relay 5; and other electrical components. The control unit 1 is connected to the battery 9 and the ignition switch 10, and power is supplied to the control unit 1 via the battery 9 and the ignition switch 10. The control unit 1 is connected to the rotation sensor 6 and the sensor 8, and electric signals outputted from these sensors are inputted to the control circuit 3 of the control unit 1.

The control circuit 3 is composed of: the CPU 30; a drive circuit 31; an input circuit 32; and a power supply circuit 33 connected to these circuits. Output signals from the rotation sensor 6 and the sensor 8 are inputted to the input circuit 32, and data, obtained from these output signals, such as rotation angle information about the motor 2 are outputted to the CPU 30. The CPU 30 calculates, from the inputted data, a current value for rotating the motor 2. The CPU 30 outputs a control signal corresponding to the result obtained by the calculation, to the inverter circuit 4 via the drive circuit 31. In addition, a current detection signal detected by the inverter circuit 4 is inputted to the CPU 30 via the input circuit 32, and the CPU 30 performs feedback control on the inverter circuit 4 on the basis of the current detection signal.

The inverter circuit 4 is composed of bridge circuits corresponding to respective windings for the three phases, i.e., the U phase, the V phase, and the W phase, of the motor 2. All of the bridge circuits corresponding to the respective phases are identical to one another, and thus a bridge circuit 4a for one phase (U phase) will be described. The bridge circuit 4a includes three semiconductor switching elements 41, 42, and 44. The semiconductor switching element 41 on a high-potential side and the semiconductor switching element 42 on a low-potential side are connected in series. One side of the semiconductor switching element 44 is connected to an intermediate connection portion between the semiconductor switching element 41 and the semiconductor switching element 42, and another side of the semiconductor switching element 44 is connected to a U-phase coil of the motor 2. The semiconductor switching element 44 has a relay function of enabling connection or disconnection between the U-phase coil and the inverter circuit 4.

A shunt resistor 43 for detecting current is connected downstream of the semiconductor switching element 42 on the low-potential side. A potential difference between both ends of the shunt resistor 43 is detected and converted into a current value. In the inverter circuit 4, terminals 48 are provided at both ends of the shunt resistor 43 in order to detect the potential difference between both ends of the shunt resistor 43. Monitor signals at various points of the inverter circuit 4 are inputted to the CPU 30 via the input circuit 32. Drive of the semiconductor switching elements 41, 42, and 44 is controlled on the basis of a signal outputted from the drive circuit 31 according to a command from the CPU 30.

The power supply relay 5 is disposed upstream of the inverter circuit 4. The power supply relay 5 includes two semiconductor switching elements 5a and 5b connected in series. The power supply relay 5 has a relay function of enabling supply or interruption of power to the inverter circuit 4. Capacitors 7 for smoothing are connected in parallel between a ground and a power supply supplied to the inverter circuit 4.

In the case where the control unit 1 is configured by using a semiconductor module including therein a plurality of semiconductor switching elements, various types of semiconductor modules are conceived. Examples of the semiconductor modules include: a semiconductor module including therein a bridge circuit composing the inverter circuit 4; a semiconductor module including therein the power supply relay 5; and a semiconductor module including therein a circuit obtained by eliminating some of the shunt resistors and the semiconductor switching elements.

<Semiconductor Module 100>

A case where the bridge circuit 4a for the one phase is formed as a semiconductor module 100 will be described. As shown in FIG. 2, the semiconductor module 100 includes: base plates 50 each having the shape of a sheet; a relay plate 60 having the shape of a sheet; terminal members 80; and electronic components each joined to one surface of a corresponding one(s) of the base plates 50. The base plates 50, the relay plate 60, and the terminal members 80 are electrically conductive members made from a same material such as copper or a copper alloy. The base plates 50, the relay plate 60, and the terminal members 80 are provided side by side on a same plane with gaps between the electrically conductive members. Here, five base plates 50 and four terminal members 80 are provided. The electronic components of the semiconductor module 100 are the semiconductor switching elements 41, 42, and 44 and the shunt resistor 43. The semiconductor switching elements 41, 42, and 44 described herein are field effect transistors (FETs). It is noted that the electronic components joined to the base plates 50 are not limited thereto.

The semiconductor switching element 41 on the high-potential side is, at a drain portion of the semiconductor switching element 41, joined to one surface of a base plate 50a. The semiconductor switching element 42 on the low-potential side is, at a drain portion of the semiconductor switching element 42, joined to one surface of a base plate 50c. The semiconductor switching element 44 is, at a drain portion of the semiconductor switching element 44, joined to one surface of a base plate 50b. The shunt resistor 43 is joined on and between one surface of a base plate 50d and one surface of a base plate 50e. The semiconductor switching elements 41, 42, and 44 and base plates 50 are connected by, for example, jumper wires 45 each formed of a copper sheet and each having the shape of a bridge. A jumper wire 45a connects a source portion of the semiconductor switching element 41, a source portion of the semiconductor switching element 44, and the base plate 50c to each other. A jumper wire 45b connects a source portion of the semiconductor switching element 42 and the base plate 50d to each other.

The base plates 50 include terminal portions 51 exposed to outside from side surfaces of the mold resin 70. Directions in which the terminal portions 51 are exposed are directions parallel to the same plane on which the base plates 50 are provided. A terminal portion 51a of the base plate 50a is connected to the battery 9 which is a power supply. A terminal portion 51e of the base plate 50e is connected to the ground. A terminal portion 51b of the base plate 50b is connected to the U phase of the motor 2 which is a load, and power obtained through conversion is outputted from the terminal portion 51b to the U phase of the motor 2. The terminal portions 51a, 51b, and 51e are high-current power terminals having large current amounts. In FIG. 2, the terminal portion 51a and the terminal portion 51e are disposed side by side on the right side of the semiconductor module 100. In FIG. 2, the terminal portion 51b is provided to extend in the upward direction from the semiconductor module 100.

The base plate 50d and the base plate 50e respectively include a terminal portion 51d and a terminal portion 51e1 for detecting a voltage between both ends of the shunt resistor 43. The terminal portion 51e and the terminal portion 51e1 are each at the ground potential. The base plate 50c includes a terminal portion 51c connected to a connection point between the semiconductor switching elements 41, 42, and 44. The terminal portion 51c is a terminal for monitoring the potential of the connection point between the semiconductor switching elements 41, 42, and 44.

Each terminal member 80 having the shape of a sheet includes a terminal portion 81 exposed to outside from a side surface of the mold resin 70. A direction in which the terminal portion 81 is exposed is a direction parallel to a same plane on which the terminal members 80 are provided. Each terminal member 80 is a terminal that has a relatively small current amount and that is used for controlling the semiconductor module 100. In FIG. 2, the terminal members 80 are disposed side by side on the lower side of the semiconductor module 100. Terminal members 80a, 80b, and 80c are gate control terminals connected to gate portions of the respective semiconductor switching elements 41, 42, and 44. Each of the terminal members 80a, 80b, and 80c and the corresponding gate portion are connected to each other by a bonding wire 46 provided in a wire bonding step. Each of the terminal members 80b and 80c and the corresponding gate portion are directly connected to each other by a bonding wire 46. Regarding the terminal member 80a and the gate portion of the semiconductor switching element 41, the gate portion and one surface of the relay plate 60 are connected to each other by a bonding wire 46a, and the one surface of the relay plate 60 and one surface of the terminal member 80a are connected to each other by a bonding wire 46b. By connecting the terminal member 80a and the gate portion to each other with division into the bonding wire 46a and the bonding wire 46b, the length of each bonding wire is shortened as compared to the case where the terminal member 80a and the gate portion are directly connected to each other by a single bonding wire. Consequently, bonding wire sagging and bonding wire sweep can be inhibited.

Wire bonding is performed from a start point which is the gate portion of each of the semiconductor switching elements 41, 42, and 44 to an end point which is a point on the corresponding terminal member 80 side. Thus, the bonding wires 46 can be cut without damaging the semiconductor switching elements 41, 42, and 44 in a wire bonding step. Although the gate portion of the semiconductor switching element 41 and the terminal member 80a are connected to each other via the relay plate 60, the start point and the end point are unchanged. A terminal member 80d and the base plate 50b are connected to each other by a bonding wire 47. The terminal member 80d is a terminal for monitoring the potential of the terminal portion 51b from which output to the motor 2 is performed.

The mold resin 70 seals: the base plates 50; the relay plate 60; the terminal members 80; the semiconductor switching elements 41, 42, and 44 and the shunt resistor 43 which are electronic components; and the bonding wires 46 and 47. The mold resin 70 is formed in an external shape that is the shape of a rectangular sheet having a sheet surface parallel to the same plane on which the base plates 50 are provided. Another surface of each base plate 50 may be exposed from the mold resin 70 in order to easily cool the base plate 50.

<Comparative Example>

Figure 5A:
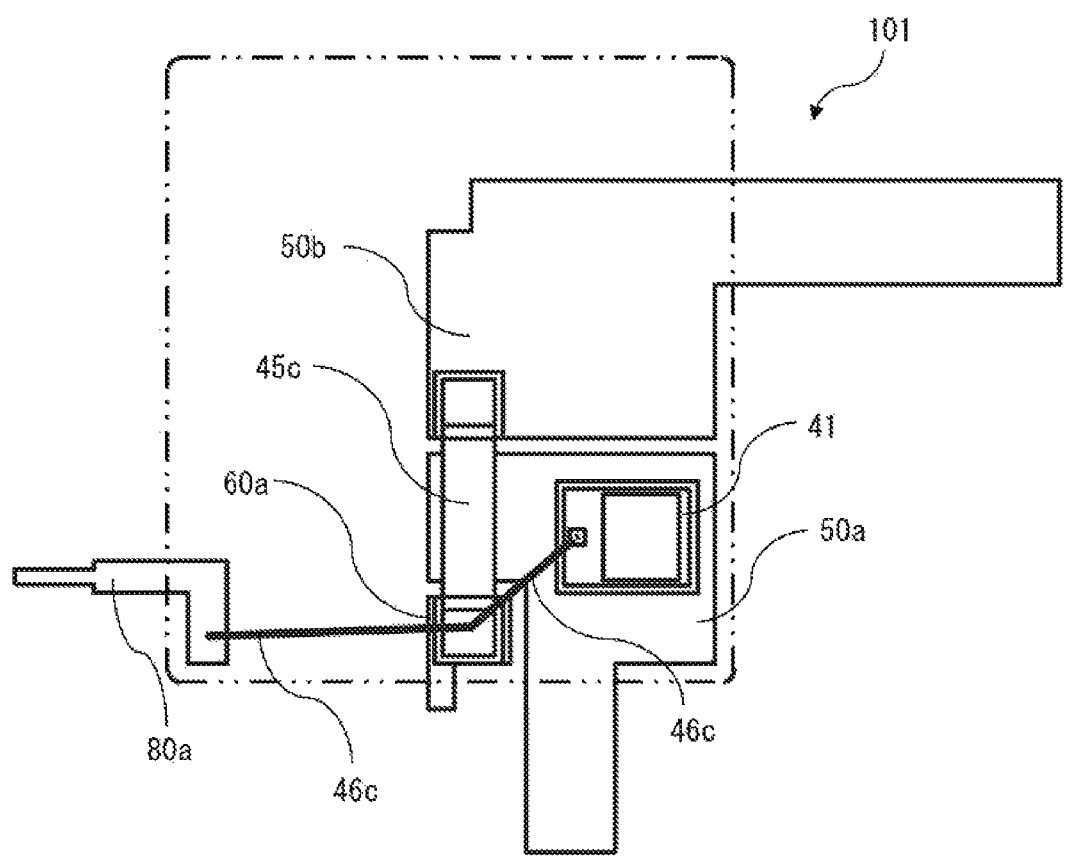
FIG. 5A is a diagram for explaining a semiconductor module in a comparative example.
Figure 5B:
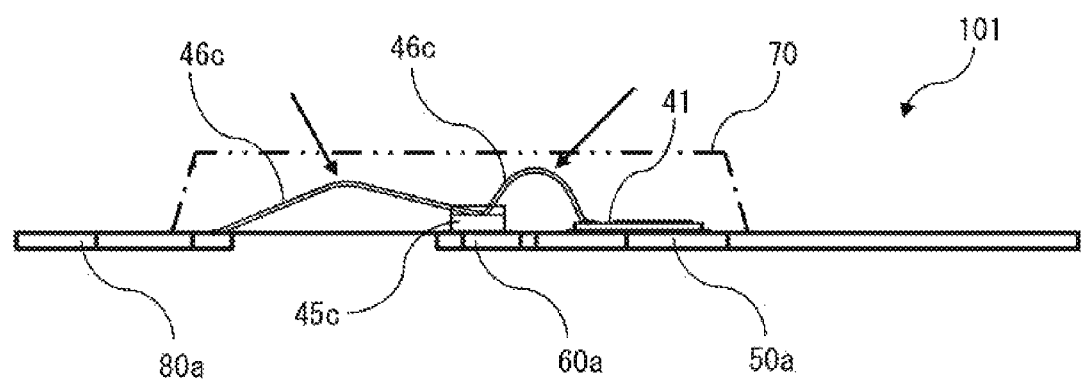
FIG. 5B is a diagram for explaining a semiconductor module in a comparative example.

A comparative example will be described with reference to FIG. 5 before the relay plate 60 which is a major part of the present disclosure is described. FIG. 5 is a diagram for explaining a semiconductor module 101 in the comparative example. FIG. 5A is a plan view showing a major part of the internal configuration of the semiconductor module 101. FIG. 5B is a side view showing the major part of the internal configuration of the semiconductor module 101. The base plate 50b and a relay plate 60a are connected to each other by a jumper wire 45c which is formed of a copper sheet and which has the shape of a bridge. The gate portion of the semiconductor switching element 41 and the terminal member 80a are connected to each other by a bonding wire 46c provided in a wire bonding step. Wire bonding between the gate portion and the terminal member 80a cannot be performed such that the bonding wire 46c extends over the jumper wire 45c. Thus, the bonding wire 46c is provided via, as a relay point, the jumper wire 45c on the relay plate 60a. The jumper wire 45c is at a higher position than one surface of each of the base plate 50a and the relay plate 60a, and thus the height of a loop of the bonding wire 46c increases at the positions indicated by the arrows in FIG. 5(b). Since the height of the loop of the bonding wire 46c increases, the thickness of the mold resin 70 increases, whereby the semiconductor module 101 is upsized.

<Relay Plate 60>

The relay plate 60 which is a major part of the present disclosure will be described. As shown in FIG. 2, the relay plate 60 has the shape of a rectangular sheet. If a direction parallel to a long side of the relay plate 60 is defined as a long side direction, each bonding wire 46 is connected to a one-side portion in the long side direction of the relay plate 60. If the relay plate 60 has the shape of a sheet, the relay plate 60 can be made from a material that is the same as the materials of the base plates 50 and can be disposed side by side with the base plates 50 on a plane that is the same as the plane of the base plates 50. Since the relay plate 60 can be disposed side by side with the base plates 50 on the plane that is the same as the plane of the base plates 50, the height of the loop of the bonding wire 46 connected to the relay plate 60 can be made low as shown in FIG. 3. Since the height of the loop of the bonding wire 46 can be reduced, the thickness of the mold resin 70 is reduced, whereby the semiconductor module 100 can be downsized. If the relay plate 60 has a rectangular shape, the size thereof can be set such that the relay plate 60 only has an area necessary for wire bonding work. Therefore, the semiconductor module 100 can be downsized.

Although the bonding wire 46 is connected to the one-side portion in the long side direction herein, the bonding wire 46 may be connected to an other-side portion in the long side direction. If the bonding wire 46 is connected to the one-side portion or the other-side portion in the long side direction of the relay plate 60, the other-side portion or the one-side portion to which the bonding wire 46 is not connected can be held down by using equipment such as a jig at the time of wire bonding work so as to fix the relay plate 60. Since the relay plate 60 can be easily fixed at the time of wire bonding work, productivity for the semiconductor module 100 can be improved.

The semiconductor switching element 41 which is an electronic component is disposed on one side in the long side direction relative to the relay plate 60, the terminal member 80a is disposed on another side in the long side direction relative to the relay plate 60, and the bonding wire 46 is connected to the one-side portion in the long side direction of the relay plate 60. In the case of this arrangement, wire bonding work can be performed in the long side direction, and thus the productivity for the semiconductor module 100 can be improved. In addition, the length of the bonding wire 46 can be shortened. In addition, the semiconductor switching element 41 can be set as a start point for wire bonding, and the terminal member 80a can be set as an end point for the wire bonding, whereby the bonding wire 46 can be cut without damaging the semiconductor switching element 41.

The bonding wire 46a connecting the semiconductor switching element 41 and the one surface of the relay plate 60 to each other, and the bonding wire 46b connecting the one surface of the relay plate 60 and the one surface of the terminal member 80a to each other, constitute a single bonding wire 46. In the case where the bonding wire 46a and the bonding wire 46b constitute a single bonding wire 46, the semiconductor switching element 41 and the terminal member 80a can be connected to each other through continuous-wire bonding work without cutting the bonding wire 46 at an intermediate portion thereof. Consequently, the productivity for the semiconductor module 100 can be improved.

The relay plate 60 is disposed such that one long side thereof extends along a side surface of the mold resin 70. In the case where the relay plate 60 is disposed along the side surface of the mold resin 70 instead of being disposed at a position enclosed by the base plates 50, a gap portion generated between the relay plate 60 and each base plate 50 can be reduced, whereby the semiconductor module 100 can be downsized. In addition, the degree of freedom in the layout of the base plates 50 can be improved. In addition, even though the relay plate 60 is provided, the size of each base plate 50 is ensured in the same manner as in a conventional configuration, and thus the heat dissipation property of the semiconductor module 100 can be maintained.

As described above, in the semiconductor module 100 according to embodiment 1, the base plates 50, the relay plate 60, and the terminal members 80 are electrically conductive members and arranged on a same plane with gaps between the electrically conductive members, the semiconductor switching element 41 and the one surface of the relay plate 60 are connected to each other by the bonding wire 46a, and the one surface of the relay plate 60 and the one surface of the terminal member 80a are connected to each other by the bonding wire 46b. Consequently, bonding wire sagging and bonding wire sweep are inhibited, and furthermore, the thickness of the mold resin 70 which performs sealing for the semiconductor module 100 can be reduced. In the case where the relay plate 60 has a rectangular shape, the size thereof can be set such that the relay plate 60 only has an area necessary for wire bonding work. Therefore, the semiconductor module 100 can be downsized.

In the case where the bonding wire 46 is connected to the one-side portion or the other-side portion in the long side direction of the relay plate 60, the other-side portion or the one-side portion to which the bonding wire 46 is not connected can be held down by using equipment such as a jig at the time of wire bonding work so as to easily fix the relay plate 60. Therefore, the productivity for the semiconductor module 100 can be improved. In the case where the semiconductor switching element 41 is disposed on the one side in the long side direction relative to the relay plate 60, the terminal member 80a is disposed on the other side in the long side direction relative to the relay plate 60, and the bonding wire 46 is connected to the one-side portion in the long side direction of the relay plate 60, wire bonding work can be performed in the long side direction, whereby the productivity for the semiconductor module 100 can be improved. In addition, the length of the bonding wire 46 can be shortened. In addition, the semiconductor switching element 41 can be set as a start point for wire bonding, and the terminal member 80a can be set as an end point for the wire bonding, whereby the bonding wire 46 can be cut without damaging the semiconductor switching element 41.

In the case where the bonding wire 46a connecting the semiconductor switching element 41 and the one surface of the relay plate 60 to each other, and the bonding wire 46b connecting the one surface of the relay plate 60 and the one surface of the terminal member 80a to each other, constitute a single bonding wire 46, the semiconductor switching element 41 and the terminal member 80a can be connected to each other through continuous-wire bonding work without cutting the bonding wire 46 at an intermediate portion thereof. Consequently, the productivity for the semiconductor module 100 can be improved. In the case where the relay plate 60 is disposed such that one long side thereof extends along a side surface of the mold resin 70, a gap portion generated between the relay plate 60 and each base plate 50 can be reduced, whereby the semiconductor module 100 can be downsized. In addition, the degree of freedom in the layout of the base plates 50 can be improved. In addition, even though the relay plate 60 is provided, the size of each base plate 50 is ensured in the same manner as in a conventional configuration, and thus the heat dissipation property of the semiconductor module 100 can be maintained.

In the case where the base plates 50, the relay plate 60, and the terminal members 80 are made from a same material, the base plates 50, the relay plate 60, and the terminal members 80 can be made from a single sheet material without adding any separate member. Consequently, the productivity for the semiconductor module 100 can be improved.

Embodiment 2

Figure 4:
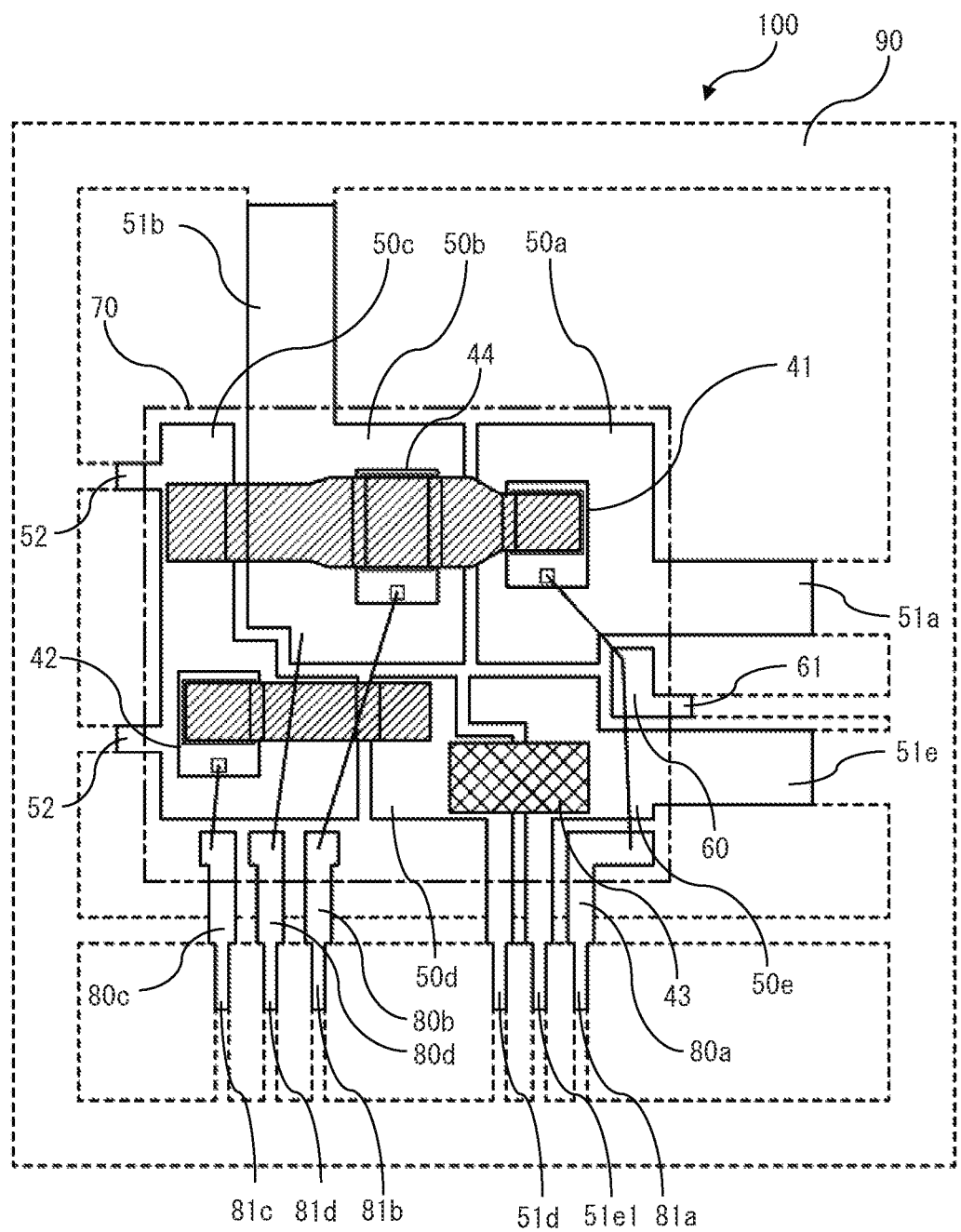
FIG. 4 is a plan view showing a semiconductor module according to embodiment 2.

A semiconductor module 100 according to embodiment 2 will be described. FIG. 4 is a plan view showing an internal configuration of the semiconductor module 100 according to embodiment 2. In FIG. 4, the mold resin 70 is excluded, and the alternate long and two short dashes line indicates the external shape of the mold resin 70. The semiconductor module 100 according to embodiment 2 includes, in addition to the components described in embodiment 1, extending-out portions 52 and 61 exposed to outside from side surfaces of the mold resin 70.

Each of the base plates 50, the relay plate 60, and the terminal members 80 includes a terminal portion 51, 81 or an extending-out portion 52, 61 exposed to outside from a side surface of the mold resin 70. Directions in which the terminal portions 51 and 81 and the extending-out portions 52 and 61 are exposed are directions parallel to the same plane on which the base plates 50 are provided. The terminal portions 51 and 81 and the extending-out portions 52 and 61 are connected to an outer frame 90 indicated by the broken lines in FIG. 4 at the time of manufacturing the semiconductor module 100. The base plates 50, the relay plate 60, the terminal members 80, and the outer frame 90 are formed of a single sheet material made from copper, a copper alloy, or the like.

The semiconductor module 100 is manufactured in a state where the base plates 50, the relay plate 60, and the terminal members 80 are connected to the outer frame 90. A method for manufacturing the semiconductor module 100 includes: a step of punching an electrically conductive member having the shape of a sheet, to form a member in which the base plates 50, the relay plate 60, and the terminal members 80 are connected to the outer frame 90; a step of joining, to the base plate 50, the semiconductor switching elements 41, 42, and 44 and the shunt resistor 43 which are electronic components; a step of connecting the semiconductor switching elements 41, 42, and 44 and the base plates 50 by the jumper wires 45; a step of connecting the semiconductor switching elements 41, 42, and 44, the relay plate 60, and the terminal members 80 by the bonding wires 46 and 47; a step of sealing the base plates 50, the relay plate 60, the terminal members 80, the semiconductor switching elements 41, 42, and 44, the shunt resistor 43, and the bonding wires 46 and 47 by the mold resin 70; and a step of cutting off the outer frame 90 from the terminal portions 51 and 81 and the extending-out portions 52 and 61.

By cutting off the outer frame 90 from the terminal portions 51 and 81 and the extending-out portions 52 and 61, the semiconductor module 100 is completed. Since each of the base plates 50, the relay plate 60, and the terminal members 80 includes a terminal portion 51, 81 or an extending-out portion 52, 61 exposed to outside from a side surface of the mold resin 70, the arrangement of the base plates 50, the relay plate 60, and the terminal members 80 can be stabilized at the time of manufacturing the semiconductor module 100, without using another fixation member such as a jig. Since the arrangement of the base plates 50, the relay plate 60, and the terminal members 80 is stabilized, the productivity for the semiconductor module 100 can be improved.

The extending-out portion 61 of the relay plate 60 will be described. The width of the extending-out portion 61 of the relay plate 60 is shorter than the length of the long side of the relay plate 60. In the case where the width of the extending-out portion 61 is set to be shorter than the length of the long side of the relay plate 60, the extending-out portion 61 can be easily cut off from the outer frame 90. Since the extending-out portion 61 can be easily cut off from the outer frame 90, the productivity for the semiconductor module 100 can be improved.

The extending-out portion 61 of the relay plate 60 is provided on a side, on which there is the one long side of the relay plate 60, so as to be located at the other-side portion in the long side direction of the relay plate 60. In FIG. 4, the extending-out portion 61 is provided at the other-side portion, of the relay plate 60, to which the bonding wire 46 is not connected. In the case where the extending-out portion 61 is provided on the side on which the bonding wire 46 is not connected, the area of the relay plate 60 at a portion thereof on the side on which the bonding wire 46 is not connected is enlarged. Consequently, this portion can be easily held down by using equipment such as a jig at the time of wire bonding work so as to fix the relay plate 60. Since the relay plate 60 can be easily fixed at the time of wire bonding work, the productivity for the semiconductor module 100 can be improved. In addition, the relay plate 60, inclusive of the extending-out portion 61, can be held down by using equipment such as a jig. Consequently, the area of the relay plate 60 can be reduced, and the relay plate 60 can be downsized. Since the relay plate 60 can be downsized, the semiconductor module 100 can be downsized.

As described above, in the semiconductor module 100 according to embodiment 2, each of the base plates 50, the relay plate 60, and the terminal members 80 includes a terminal portion 51, 81 or an extending-out portion 52, 61 exposed to outside from a side surface of the mold resin 70, and the directions in which the terminal portions 51 and 81 and the extending-out portions 52 and 61 are exposed are directions parallel to the same plane on which the base plates 50 are provided. Consequently, at the time of manufacturing, the terminal portions 51 and 81 and the extending-out portions 52 and 61 can be easily connected to the outer frame 90 which is to be cut off therefrom. Therefore, the arrangement of the base plates 50, the relay plate 60, and the terminal members 80 at the time of manufacturing the semiconductor module 100 can be stabilized. In addition, since the arrangement of the base plates 50, the relay plate 60, and the terminal members 80 is stabilized, the productivity for the semiconductor module 100 can be improved.

In the case where the width of the extending-out portion 61 is set to be shorter than the length of the long side of the relay plate 60, the extending-out portion 61 can be easily cut off from the outer frame 90. Consequently, the productivity for the semiconductor module 100 can be improved. In the case where the extending-out portion 61 of the relay plate 60 is provided on a side, on which there is one long side of the relay plate 60, so as to be located at the one-side portion or the other-side portion, in the long side direction of the relay plate 60, which is on the side on which the bonding wire 46 is not connected, the area at the portion on the side on which the bonding wire 46 is not connected is enlarged. Consequently, this portion can be easily held down by using equipment such as a jig at the time of wire bonding work so as to fix the relay plate 60. Since the relay plate 60 can be easily fixed at the time of wire bonding work, the productivity for the semiconductor module 100 can be improved. In addition, since the relay plate 60, inclusive of the extending-out portion 61, can be held down by using equipment such as a jig, the relay plate 60 can be downsized. Since the relay plate 60 can be downsized, the semiconductor module 100 can be downsized.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 control unit
2 motor
3 control circuit
4 inverter circuit
4a bridge circuit
5 power supply relay
5a semiconductor switching element
5b semiconductor switching element
6 rotation sensor
7 capacitor
8 sensor
9 battery
10 ignition switch
30 CPU
31 drive circuit
32 input circuit
33 power supply circuit
41 semiconductor switching element
42 semiconductor switching element
43 shunt resistor
44 semiconductor switching element
45 jumper wire
46 bonding wire
47 bonding wire
48 terminal
50 base plate
51 terminal portion
52 extending-out portion
60 relay plate
60a relay plate
61 extending-out portion
70 mold resin
80 terminal member
81 terminal portion
90 outer frame
100 semiconductor module
101 semiconductor module
200 electric power steering device

The invention claimed is:

1. A semiconductor module comprising:
a base plate having a shape of a sheet;
a relay plate having a shape of a sheet;
a terminal member;
an electronic component joined to one surface of the base plate; and
a mold resin sealing the base plate, the relay plate, the terminal member, the electronic component, and bonding wire, wherein
the base plate, the relay plate, and the terminal member are electrically conductive members and arranged as a same plane with gaps between the electrically conductive members,
the electronic component and one surface of the relay plate are connected to each other by a first bonding wire,
the one surface of the relay plate and one surface of the terminal member are connected to each other by a second bonding wire,
the relay plate has a shape of a rectangular sheet,
if a direction parallel to a long side of the relay plate is defined as a long side direction, each bonding wire is connected to a one-side portion or an other-side portion in the long side direction of the relay plate,
the mold resin is formed in an external shape that is a shape of a rectangular sheet having a sheet surface parallel to the same plane, and
the relay plate is disposed such that one long side thereof extends along a side surface of the mold resin.

2. The semiconductor module according to claim 1, wherein
the electronic component is disposed on one side in the long side direction relative to the relay plate,
the terminal member is disposed on another side in the long side direction relative to the relay plate, and
the first bonding wire is connected to the one-side portion in the long side direction of the relay plate.

3. The semiconductor module according to claim 2, wherein the first bonding wire connecting the electronic component and the one surface of the relay plate to each other, and the second bonding wire connecting the one surface of the relay plate and the one surface of the terminal member to each other, constitute a single bonding wire.

4. The semiconductor module according to claim 1, wherein the base plate, the relay plate, and the terminal member are made from a same material.

5. The semiconductor module according to claim 1, wherein
each of the base plate, the relay plate, and the terminal member includes a terminal portion or an extending-out portion exposed to outside from a side surface of the mold resin, and
directions in which the terminal portion and the extending-out portion are exposed are directions parallel to the same plane.

6. The semiconductor module according to claim 5, wherein
a width of the extending-out portion of the relay plate is shorter than a length of the long side of the relay plate, and
the extending-out portion of the relay plate is provided on a side, on which there is one long side of the relay plate, so as to be located at the one-side portion or the other-side portion in the long side direction of the relay plate.

7. The semiconductor module according to claim 3, wherein each of the base plate, the relay plate, and the terminal member includes a terminal portion or an extending-out portion exposed to outside from a side surface of the mold resin,
directions in which the terminal portion and the extending-out portion are exposed are directions parallel to the same plane,
a width of the extending-out portion of the relay plate is shorter than a length of the long side of the relay plate, and
the extending-out portion of the relay plate is provided on a side, on which there is one long side of the relay plate, so as to be located at the one-side portion or the other-side portion in the long side direction of the relay plate.

8. The semiconductor module according to claim 7, wherein the base plate, the relay plate, and the terminal member are made from a same material.

9. Means for preventing wire sag and wire sweep in a semiconductor module, comprising:
- a base plate, a relay plate, and a terminal member being electrically conductive members and arranged as a same plane with gaps between the electrically conductive members;
- a first bonding wire connecting the electronic component and one surface of the relay plate, and a second bonding wire connecting the terminal member and the one surface of the relay plate; and
- a mold resin sealing the base plate, the relay plate, the terminal member, the electronic component, the first bonding wire, and the second bonding wire, wherein the relay plate has a shape of a rectangular sheet, if a direction parallel to a long side of the relay plate is defined as a long side direction, each bonding wire is connected to a one-side portion or an other-side portion in the long side direction of the relay plate, the mold resin is formed in an external shape that is a shape of a rectangular sheet having a sheet surface parallel to the same plane, and the relay plate is disposed such that one long side thereof extends along a side surface of the mold resin.

* * * * *